United States Patent [19]

Tsunoda

[11] Patent Number: 5,286,655

[45] Date of Patent: Feb. 15, 1994

[54] METHOD OF MANUFACTURING A SEMICONDUCTOR DEVICE OF AN ANODE SHORT CIRCUIT STRUCTURE

[75] Inventor: Tetsujiro Tsunoda, Fujisawa, Japan

[73] Assignee: Kabushiki Kaisha Toshiba, Kawasaki, Japan

[21] Appl. No.: 74,618

[22] Filed: Jun. 11, 1993

[30] Foreign Application Priority Data

Jun. 12, 1992 [JP] Japan .................................. 4-153462

[51] Int. Cl.$^5$ .......................................... H01L 21/332
[52] U.S. Cl. ....................................... 437/6; 437/152; 148/DIG. 126
[58] Field of Search ........................ 437/6, 31, 40, 150, 437/152, 954; 148/DIG. 126

[56]    References Cited

U.S. PATENT DOCUMENTS

| 4,757,025 | 7/1988 | Bender ................................ 437/152 |
| 4,920,062 | 4/1990 | Tsunoda ................................... 437/6 |
| 5,178,370 | 1/1993 | Clark et al. .......................... 437/31 |
| 5,183,769 | 2/1993 | Rutter et al. ............................ 437/6 |

Primary Examiner—Brian E. Hearn
Assistant Examiner—Chandra Chaudhari
Attorney, Agent, or Firm—Oblon, Spivak, McClelland, Maier & Neustadt

[57]    ABSTRACT

The present invention provides a method of manufacturing a semiconductor device, comprising the steps of selectively diffusing an impurity of a first conductivity type and another impurity of a second conductivity type into a main surface region of a semiconductor substrate so as to form first semiconductor regions of the first conductivity type and second semiconductor regions of the second conductivity type, forming a first semiconductor layer of the second conductivity type on the semiconductor substrate, said first semiconductor layer being of at least a single layer structure, forming element regions of the first and second conductivity types by thermal diffusion of impurities into the first semiconductor layer, and polishing the opposite main surface of the semiconductor substrate to expose the first semiconductor regions of the first conductivity type and the second semiconductor regions of the second conductivity type. The first semiconductor layer may be of a laminate structure consisting of a plurality of semiconductor layers differing from each other in the impurity concentration.

7 Claims, 8 Drawing Sheets

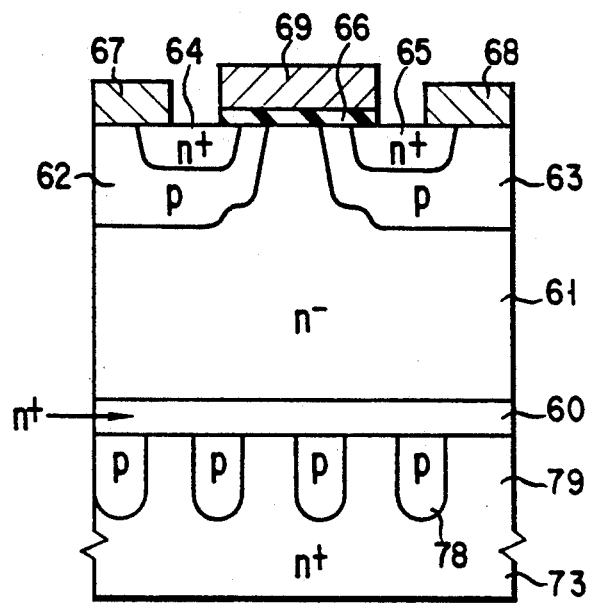
F I G. 18
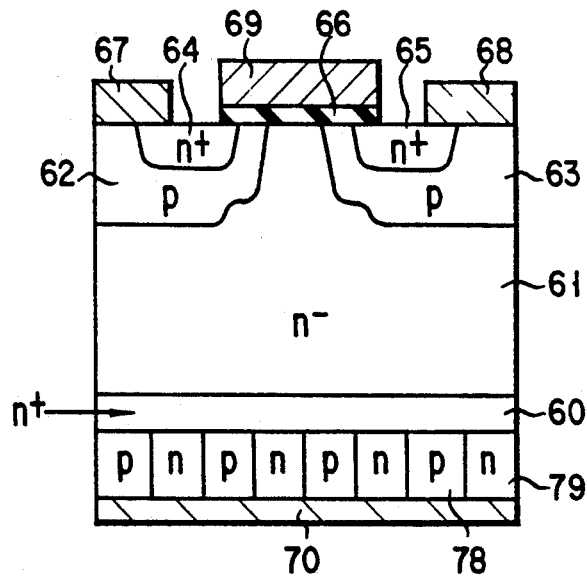
F I G. 19
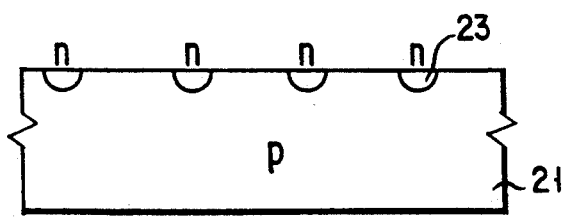
F I G. 20

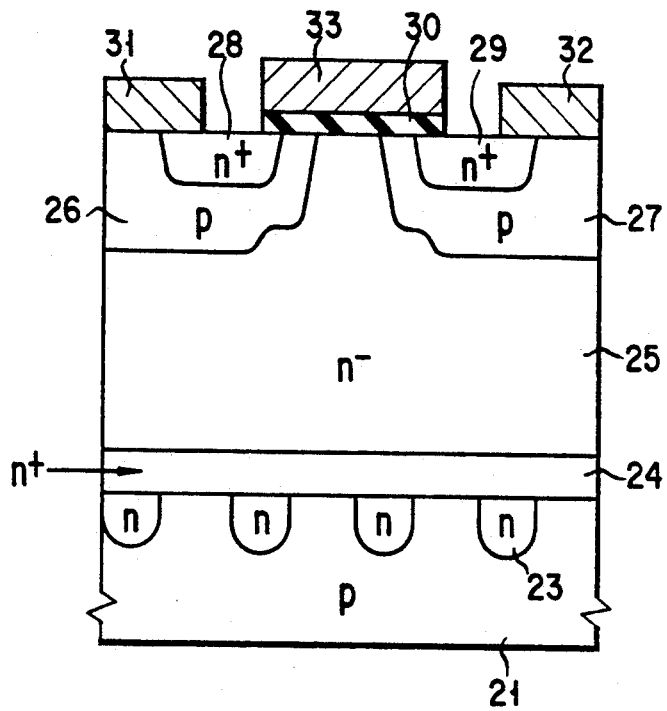
F I G. 21
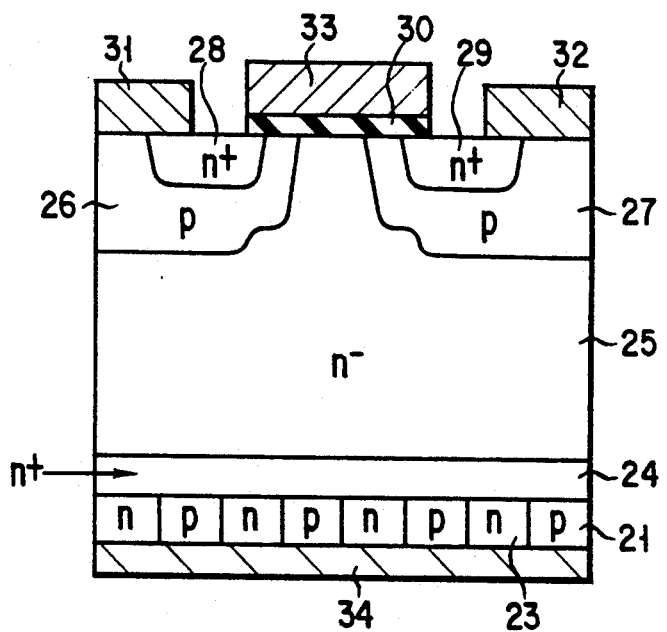
F I G. 22
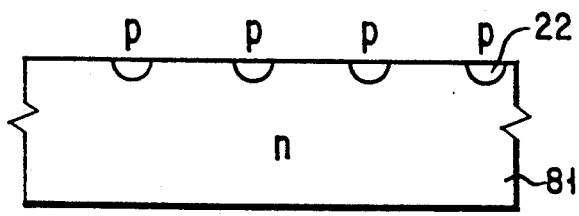
F I G. 23

METHOD OF MANUFACTURING A SEMICONDUCTOR DEVICE OF AN ANODE SHORT CIRCUIT STRUCTURE

BACKGROUND OF THE INVENTION

1. Field of the Invention

The present invention relates to a method of manufacturing a semiconductor device such as an IGBT or a thyristor.

2. Description of the Related Art

In general, a semiconductor device such as an IGBT or a thyristor is widely used as a switching element such as an inverter for controlling, for example, a motor. In order to diminish the power conversion loss, the switching element of this type is required to be operated at a high speed and to be turned on at a low forward voltage.

FIG. 1 shows an n$^-$-channel type IGBT widely known to the art. As shown in the drawing, the conventional n$^-$-channel type IGBT comprises a gate electrode 1, emitter electrodes 2, 3, a gate oxide film 4, emitter regions 5, 6, p-type base regions 7, 8, an n$^-$-type layer 9, an n$^+$-type buffer layer 10, and a collector electrode 12. In manufacturing the IGBT shown in FIG. 1, used is a wafer comprising a p-type semiconductor layer of a high impurity concentration, an n-type semiconductor layer of a high impurity concentration formed on the p-type semiconductor layer, and an n-type semiconductor layer of a low impurity concentration formed on the n-type layer of the high impurity concentration. The IGBT is obtained by forming element regions in the surface region of the wafer by means of thermal diffusion of impurities.

FIG. 2 shows a conventional anode short-circuit type IGBT. The anode short-circuit type IGBT shown in FIG. 2 is substantially equal to the IGBT shown in FIG. 1, except that, in the IGBT shown in FIG. 2, the p$^+$-type layer 11 in FIG. 1 is replaced by a layer 13 consisting of p-type regions and n-type regions which are formed alternately. Incidentally, the reference numerals common with FIGS. 1 and 2 denote the same members of the IGBT. The anode short-circuit type IGBT of this type is superior to the ordinary IGBT in the relationship between the switching characteristics and the on-voltage, particularly, in the relationship on the side of a low current.

In the manufacture of an ordinary semiconductor element, it is necessary for the semiconductor wafer used to have a thickness of at least about 250 μm where the wafer has a diameter of 5 inches. It should be noted that various steps such as a diffusion step, an etching step and a patterning step are involved in the manufacture of the semiconductor element. Naturally, the semiconductor wafer is transferred several times in the manufacturing process of the semiconductor element, with the result that, the wafer, if unduly thin, is likely to be cracked in the transfer step.

When it comes to the IGBT, the optimum thickness of the n$^+$-type buffer layer 10 shown in FIG. 2 is about 15 μm. On the other hand, the optimum thickness of the n$^-$-type layer 9 depends on the grade of the withstand voltage. In the case of an IGBT having a withstand voltage of 1200 V, which has a large demand, the optimum thickness of the n$^-$-type layer 9 is about 100 μm. In this case, the total thickness of the n$^-$-type layer 9 and the n$^+$-type buffer layer 10 is only about 115 μm. It follows that, in the case of manufacturing an IGBT element by using a wafer having a diameter of 5 inches, it is necessary for the layer 13 to have a thickness of at least about 140 μm. What should be noted is that, if the layer 13 has such a large thickness, it is practically impossible to diffuse an n-type impurity through the back surface of the wafer to form an anode short-circuit structure as shown in FIG. 2. To be more specific, a very long diffusion time is required for the n-type impurity diffused through the back surface of the wafer to reach the n$^+$-type buffer layer 10. In addition, the impurity in the n$^+$-type buffer layer 10 is also diffused during the diffusion step, resulting in failure to obtain an ideal concentration profile of the impurity in the n$^+$-type buffer layer 10. Such being the situation, it was substantially impossible to obtain an anode short-circuit structure exhibiting satisfactory characteristics.

SUMMARY OF THE INVENTION

An object of the present invention is to provide a method of manufacturing a semiconductor device of an anode short-circuit structure, which comprises a thin n$^-$-type layer having a withstand voltage of about 2000 V or less and an n$^+$-type buffer layer having an ideal impurity concentration profile.

According to an aspect of the present invention, there is provided a method of manufacturing a semiconductor device, comprising the steps of:

selectively diffusing an impurity of a first conductivity type and another impurity of a second conductivity type into a main surface region of a semiconductor substrate so as to form first semiconductor regions of the first conductivity type and second semiconductor regions of the second conductivity type;

forming a first semiconductor layer of the second conductivity type on the semiconductor substrate, said first semiconductor layer being of at least a single layer structure;

forming element regions of the first and second conductivity types by thermal diffusion of impurities into the first semiconductor layer; and polishing the opposite main surface of the semiconductor substrate to expose the first semiconductor region of the first conductivity type and the second semiconductor region of the second conductivity type.

According to another aspect of the present invention, there is provided a method of manufacturing a semiconductor device, comprising the steps of:

selectively diffusing an impurity of a first conductivity type and another impurity of a second conductivity type into a main surface region of a semiconductor substrate so as to form first semiconductor regions of the first conductivity type and second semiconductor regions of the second conductivity type;

selectively forming third semiconductor regions of the first conductivity type and fourth semiconductor regions of the second conductivity type in the opposite main surface region of the semiconductor substrate by selectively diffusing impurities of the first and second conductivity types into the substrate through the opposite main surface;

forming a first semiconductor layer of the second conductivity type on the semiconductor substrate, said first semiconductor layer being of at least a single layer structure;

forming element regions of the first and second conductivity types by thermal diffusion of impurities into the first semiconductor layer; and combining the first and third semiconductor regions by thermal diffusion of an impurity and combining the second and fourth semiconductor regions by thermal diffusion of another impurity.

According to another aspect of the present invention, there is provided a method of manufacturing a semiconductor device, comprising the steps of:

selectively forming by thermal diffusion of an impurity fifth semiconductor regions of second conductivity type in a main surface region of a semiconductor substrate of a first conductivity type having a high impurity concentration;

forming a second semiconductor layer of the first conductivity type or a second conductivity type on the semiconductor substrate, said second semiconductor layer having a low impurity concentration;

selectively forming first semiconductor regions of the first conductivity type and second semiconductor regions of the second conductivity type in the second semiconductor layer by selective diffusion of impurities;

forming a first semiconductor layer of the second conductivity type on the second semiconductor layer, said first semiconductor layer being of at least a single layer structure;

forming element regions of the first and second conductivity types on the first semiconductor layer by thermal diffusion of impurities;

applying a heat treatment to combine the first semiconductor regions and the main surface region of a semiconductor substrate, and the second and fifth semiconductor regions by thermal diffusion of an impurity; and polishing the opposite main surface of the semiconductor substrate to expose the semiconductor regions of the first and second conductivity types.

According to another aspect of the present invention, there is provided a method of manufacturing a semiconductor device, comprising the steps of:

selectively forming sixth semiconductor regions of a first conductivity type in a main surface region of a semiconductor substrate of a second conductivity type having a high impurity concentration;

forming a second semiconductor layer of the first or second conductivity type having a low impurity concentration on the semiconductor substrate.;

selectively forming first semiconductor regions of the first conductivity type and second semiconductor regions of the second conductivity type in the second semiconductor layer by means of a selective impurity diffusion;

forming a first semiconductor layer of the second conductivity type on the second semiconductor layer, said first semiconductor layer being of at least a single layer structure;

forming element regions of the first and second conductivity types on the first semiconductor layer by means of thermal diffusion of impurities;

applying a heat treatment to combine the second semiconductor regions and the main surface of a semiconductor substrate, and the first and sixth semiconductor regions by thermal diffusion of an impurity; and polishing the opposite main surface of the semiconductor substrate to expose the semiconductor regions of the first and second conductivity types.

According to another aspect of the present invention, there is provided a method of manufacturing a semiconductor device, comprising the steps of:

selectively forming second semiconductor regions of a second conductivity type in a main surface region of a semiconductor substrate of a first conductivity type by impurity diffusion;

forming a first semiconductor layer of the second conductivity type on the semiconductor substrate, said first semiconductor layer being of at least a single layer structure;

forming element regions of the first and second conductivity types on the first semiconductor layer by thermal diffusion of impurities; and polishing the opposite main surface of the semiconductor substrate to expose the second semiconductor region of the second conductivity type.

Further, according to still another aspect of the present invention, there is provided a method of manufacturing a semiconductor device, comprising the steps of:

selectively forming first semiconductor regions of a first conductivity type by impurity diffusion in a main surface region of a semiconductor substrate of a second conductivity type;

forming a first semiconductor layer of the second conductivity type on the semiconductor substrate, said first semiconductor layer being of at least a single layer structure;

forming element regions of the first and second conductivity types by thermal diffusion of impurities into the first semiconductor layer; and polishing the opposite main surface of the semiconductor substrate to expose the first semiconductor region of the first conductivity type.

It is possible for the first semiconductor layer to be of a laminate structure consisting of a plurality of layers differing from each other in the impurity concentration.

In the semiconductor device manufactured by the method of the present invention, it is possible for the $n^+$-type buffer layer to maintain an ideal impurity concentration profile even if the element has a withstand voltage of 2000 V or less. It follows that the semiconductor device manufactured by the method of the present invention exhibits a satisfactory relationship between the switching characteristics and the on-voltage. Particularly, the relationship in the low current region can be markedly improved in the present invention, compared with the conventional IGBT.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18 is a cross sectional view showing other steps of manufacturing a semiconductor device according to the fourth embodiment of the present invention;

FIG. 19 is a cross sectional view showing further steps of manufacturing a semiconductor device according to the fourth embodiment of the present invention;

FIG. 20 is a cross sectional view showing a step of manufacturing a semiconductor device according to a fifth embodiment of the present invention;

FIG. 21 is a cross sectional view showing other steps of manufacturing a semiconductor device according to the fifth embodiment of the present invention;

FIG. 22 is a cross sectional view showing other steps of manufacturing a semiconductor device according to the fifth embodiment of the present invention;

FIG. 23 is a cross sectional view showing a step of manufacturing a semiconductor device according to a sixth embodiment of the present invention;

DETAILED DESCRIPTION OF THE PREFERRED EMBODIMENTS

Let us describe six embodiments of the present invention which are applied to the manufacture of an $n^-$-channel IGBT.

First Embodiment

Figure 1:
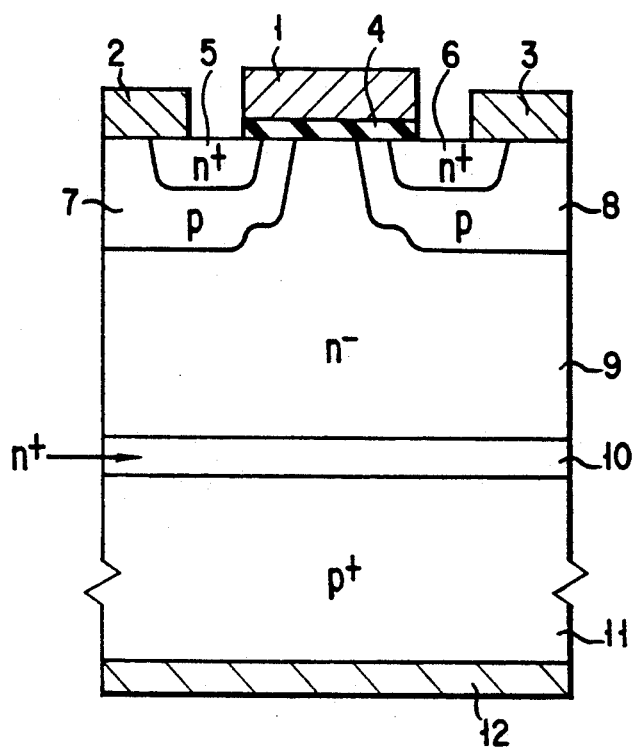
FIG. 1 is a cross sectional view showing a conventional $n^-$-channel type IGBT.
Figure 2:
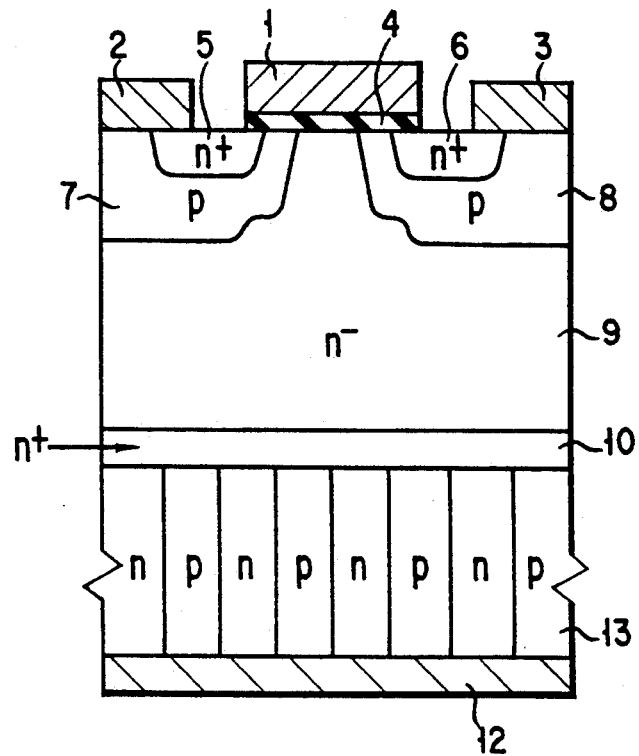
FIG. 2 is a cross sectional view showing a conventional anode short-circuit type IGBT.
Figure 3:
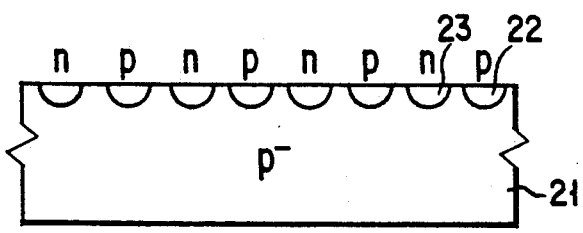
FIG. 3 is a cross sectional view showing a step of manufacturing a semiconductor device according to a first embodiment of the present invention.
Figure 4:
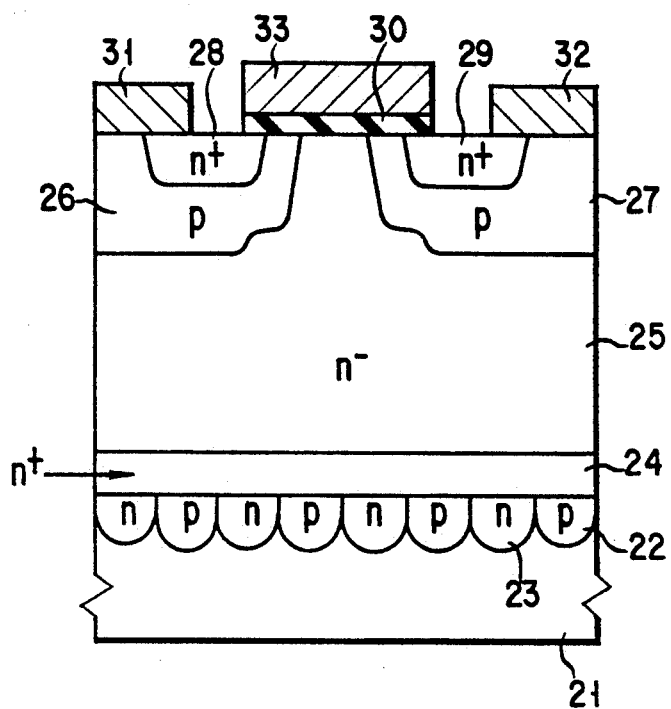
FIG. 4 is a cross sectional view showing other steps of manufacturing a semiconductor device according to the first embodiment of the present invention.
Figure 5:
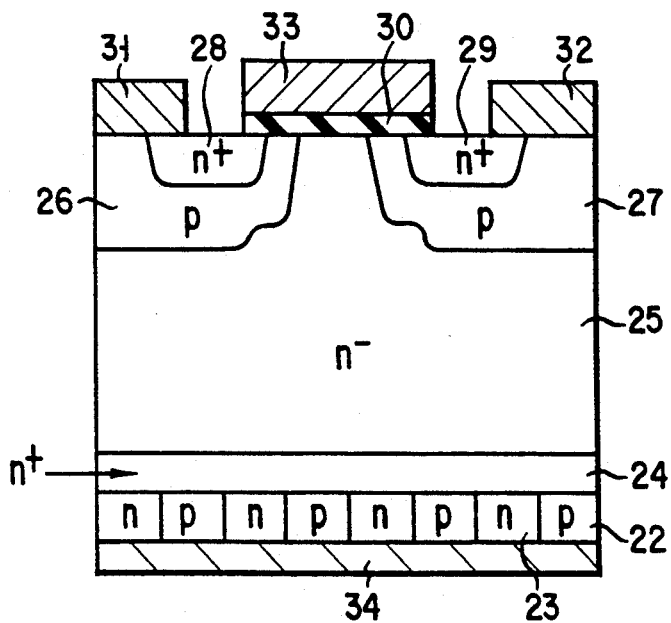
FIG. 5 is a cross sectional view showing further steps of manufacturing a semiconductor device according to the first embodiment of the present invention.

This embodiment corresponds to claim 1 and comprises the manufacturing steps shown in FIGS. 3 to 5. In the first step, p-type regions 22 having a high impurity concentration and n-type regions 23 having a high impurity concentration are selectively formed by diffusing a p-type impurity and an n-type impurity into a p-type semiconductor substrate 21, as shown in FIG. 3. The p-type semiconductor substrate 21 has a thickness of 400 $\mu$m. In the next step, an $n^+$-type buffer layer 24 having a thickness of 15 $\mu$m and an $n^-$-type layer 25 having a thickness of 105 $\mu$m are successively formed in this order on the p-type regions 22 and the n-type regions 23, as shown in FIG. 4. In this step, the thickness of the entire system is about 520 $\mu$m. Then, element regions including p-type base regions 26, 27, $n^+$-type emitter regions 28, 29, a gate oxide film 30, emitter electrodes 31, 32 and a gate electrode 33 are successively formed in the surface region of the $n^-$-type layer 25.

Further, the back surface of the semiconductor substrate is polished to diminish its thickness by about 370 $\mu$m so as to expose the p-type regions 22 having a high impurity concentration and the n-type regions 23 having a high impurity concentration. After the polishing treatment, a metal thin film 34 acting as a collector electrode is deposited on the polished surface to cover the p-type regions 22 and the n-type regions 23 so as to manufacture an anode short-circuit type IGBT.

Second Embodiment

Figure 6:
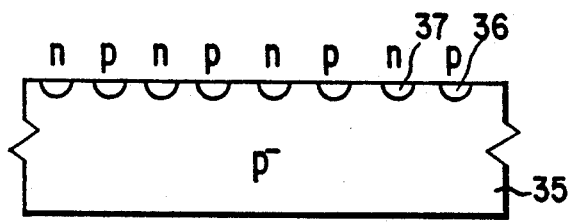
FIG. 6 is a cross sectional view showing a step of manufacturing a semiconductor device according to a second embodiment of the present invention.
Figure 7:
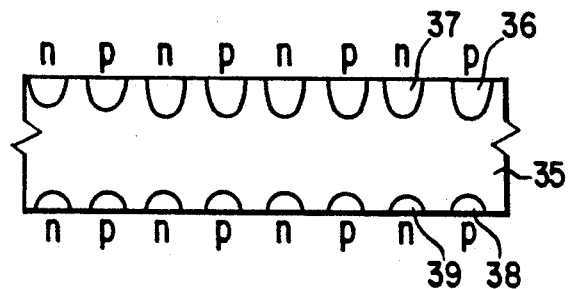
FIG. 7 is a cross sectional view showing another step of manufacturing a semiconductor device according to the second embodiment of the present invention.
Figure 8:
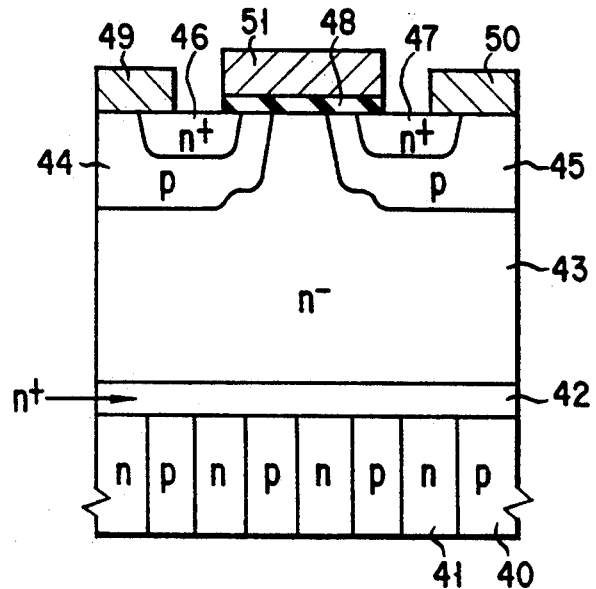
FIG. 8 is a cross sectional view showing other steps of manufacturing a semiconductor device according to the second embodiment of the present invention.
Figure 9:
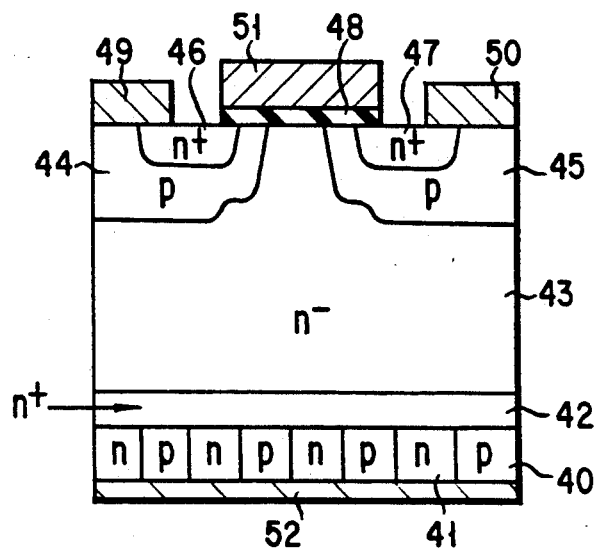
FIG. 9 is a cross sectional view showing further steps of manufacturing a semiconductor device according to the second embodiment of the present invention.

This embodiment corresponds to claim 2 and comprises the manufacturing steps shown in FIGS. 6 to 9. In the first step, p-type regions 36 having a high impurity concentration and n-type regions 37 having a high impurity concentration are selectively formed by diffusing a p-type impurity and an n-type impurity into a main surface region of a p-type semiconductor substrate 35, as shown in FIG. 6. In the next step, p-type regions 38 having a high impurity concentration and n-type regions 39 having a high impurity concentration are formed by diffusing a p-type impurity and an n-type impurity into a main back surface region of the p-type semiconductor substrate 35, as shown in FIG. 7. It should be noted that these p-type regions 38 and the n-type regions 39 formed in the back surface region of the semiconductor substrate 35 are positioned to be aligned in the vertical direction in the drawing with the p-type regions 36 and the n-type regions 37 formed in said one main surface (or front surface) region of the semiconductor substrate 35. The impurity diffusion is continued until the p-type regions 36 and 38 formed in the front and back surface regions of the semiconductor substrate 35 are joined each other to form p-type regions 40 extending across the semiconductor substrate 35, as shown in FIG. 8. Likewise, the n-type regions 37 and 39 formed in the front and back surface regions of the semiconductor substrate 35 are joined each other to form n-type regions 41 extending across the semiconductor substrate 35. Alternatively, it is possible to form these p-type regions 40 and the n-type regions 41 by a heat treatment for the impurity diffusion after formation of the p-type regions 38 and the n-type regions 39 in the back surface region of the semiconductor substrate.

Then, an n+-type buffer layer 42 having a thickness of 15 μm and an n−-type layer 43 having a thickness of 105 μm are successively formed in this order on the p-type regions 40 and the n-type regions 41, as shown in FIG. 8. In this step, the thickness of the entire system is about 520 μm. Then, element regions including p-type base regions 44, 45, n+-type emitter regions 46, 47, a gate oxide film 48, emitter electrodes 49, 50 and a gate electrode 51 are successively formed in the surface region of the n−-type layer 43.

It is certainly possible to obtain an anode short-circuit type IGBT by directly depositing a metal thin film on the back surface of the p-type semiconductor substrate 35. However, it is desirable to diminish the thickness of the chip in order to improve the heat dissipation of the element. To be more specific, the back surface of the p-type semiconductor substrate 35 is polished to diminish its thickness by about 200 μm. After the polishing treatment, a metal thin film 52 acting as a collector electrode is deposited on the polished surface to cover the p-type regions 40 and the n-type regions 41 so as to manufacture an anode short-circuit type IGBT which permits dissipating heat efficiently.

Third Embodiment

Figure 10:
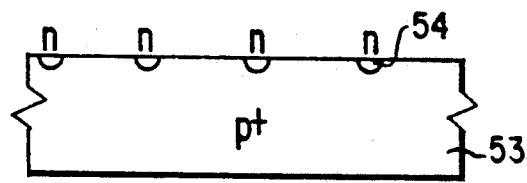
FIG. 10 is a cross sectional view showing a step of manufacturing a semiconductor device according to a third embodiment of the present invention

This embodiment corresponds to claim 3 and comprises the manufacturing steps shown in FIGS. 10 to 14. In the first step, n-type regions 54 having a high impurity concentration are selectively formed by diffusing an n type impurity into a main surface region of a p+-type semiconductor substrate 53, as shown in FIG. 10. The substrate 53 has an impurity concentration of $1 \times 10^{19}$ atoms/cm$^2$, and a thickness of 400 μm. Also, the n-type regions 54 are formed to have a depth of about 5 μm.

Figure 11:
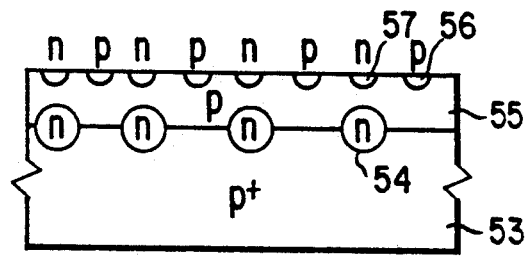
FIG. 11 is a cross sectional view showing other steps of manufacturing a semiconductor device according to the third embodiment of the present invention.
Figure 12:
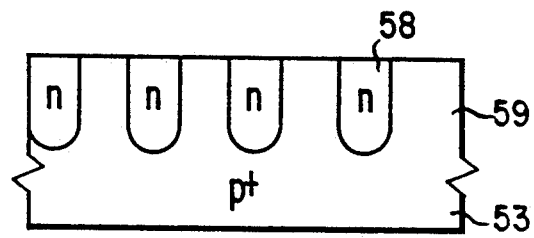
FIG. 12 is a cross sectional view showing another step of manufacturing a semiconductor device according to the third embodiment of the present invention.

In the next step, a p−-type layer 55 having a low impurity concentration is formed to have a thickness of about 20 μm by epitaxial growth on the surface of the substrate 53 as shown in FIG. 11, followed by selectively forming p-type regions 56 having a high impurity concentration and n-type regions 57 having a high impurity concentration by diffusing a p-type impurity and an n-type impurity into a surface region of the epitaxial layer 55. It should be noted that these n-type regions 57 formed in the epitaxial layer 55 are positioned to be aligned in the vertical direction in the drawing with the n-type regions 54 formed in said one main surface (or front surface) region of the semiconductor substrate 53. The impurity diffusion is continued until the n-type regions 57 having a high impurity concentration, which are formed in the surface region of the epitaxial layer 55, are joined to the n-type regions 54 formed in the substrate 53 to form n-type regions 58 having a larger area, as shown in FIG. 12. Likewise, the p-type regions 56 formed in a surface region of the epitaxia layer 55 are joined to the p-type semiconductor substrate 53 having a high impurity concentration so as to form p-type regions 59 having a large area. Alternatively, it is possible to form these p-type regions 59 and the n-type regions 58 by a heat treatment for the impurity diffusion after formation of the p-type regions 56 and the n-type regions 57 in the surface region of the epitaxial layer 55.

Figure 13:
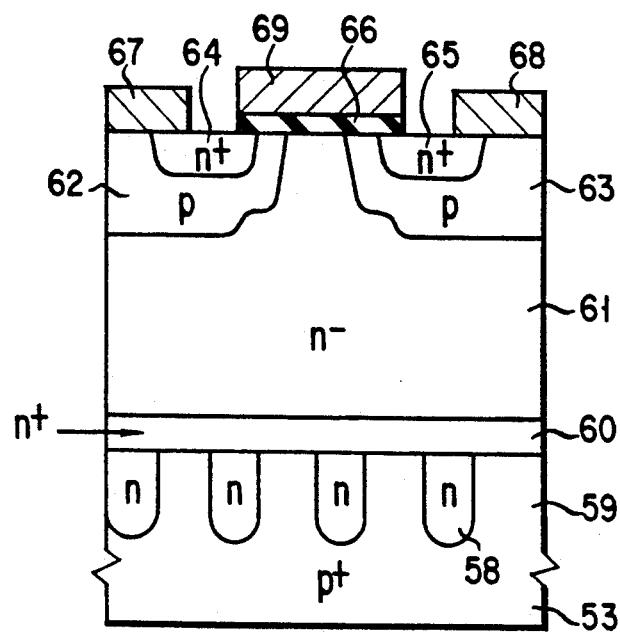
FIG. 13 is a cross sectional view showing other steps of manufacturing a semiconductor device according to the third embodiment of the present invention.
Figure 14:
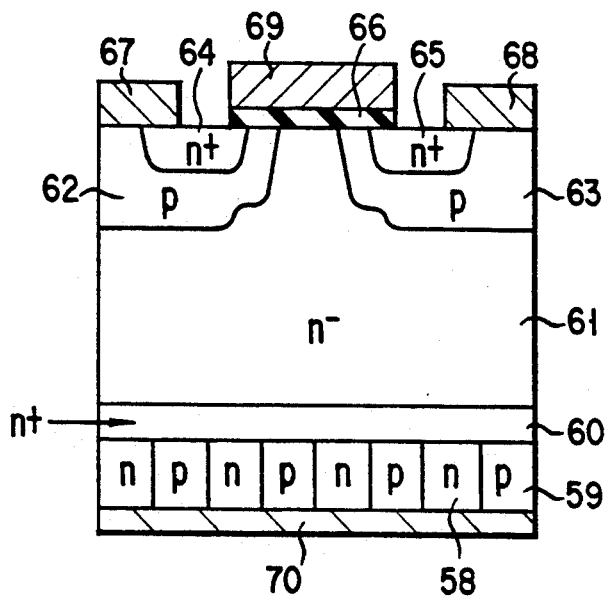
FIG. 14 is a cross sectional view showing further steps of manufacturing a semiconductor device according to the third embodiment of the present invention

Then, an n+-type buffer layer 60 having a thickness of 15 μm and an n−-type layer 61 having a thickness of 105 μm are successively formed in this order on the p-type regions 59 and the n-type regions 58, as shown in FIG. 13. In the next step, element regions including p-type base regions 62, 63, n+-type emitter regions 64, 65, a gate oxide film 66, emitter electrodes 67, 68 and a gate electrode 69 are successively formed in the surface region of the n−-type layer 61. In this step, the thickness of the entire system is about 520 μm.

Then, the back surface of the p-type semiconductor substrate 53 is polished to diminish its thickness by about 390 μm. After the polishing treatment, a metal thin film 70 acting as a collector electrode is deposited on the polished surface to cove the p-type regions 59 having a high impurity concentration and the n-type regions 58 having a high impurity concentration so as to manufacture an anode short-circuit type IGBT which permits dissipating heat efficiently. In this embodiment, each of the p-type regions 59 and the n-type regions 58 has a high impurity concentration, with the result that a satisfactory ohmic contact can be achieved between these diffusion regions and the metal thin film (collector electrode) 70.

Fourth Embodiment

Figure 15:
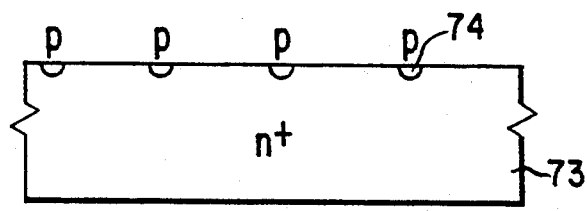
FIG. 15 is a cross sectional view showing a step of manufacturing a semiconductor device according to a fourth embodiment of the present invention.

This embodiment corresponds to claim 4 and comprises the manufacturing steps shown in FIGS. 15 to 19. In the first step, p-type regions 74 having a high impurity concentration are selectively formed by diffusing a p-type impurity into a main surface region of an n+-type semiconductor substrate 73, as shown in FIG. 15. The substrate 73 has an impurity concentration of $1 \times 10^{19}$ atoms/cm$^2$, and a thickness of 400 μm. Also, the p-type regions 74 are formed to have a depth of about 5 μm.

Figure 16:
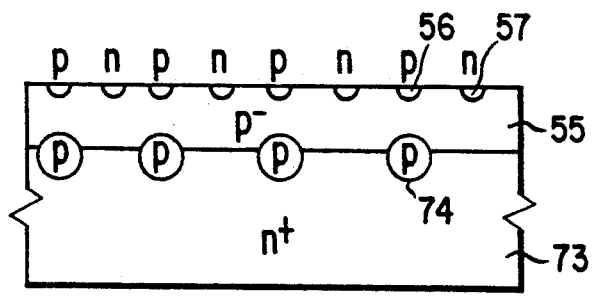
FIG. 16 is a cross sectional view showing other steps of manufacturing a semiconductor device according to the fourth embodiment of the present invention.
Figure 17:
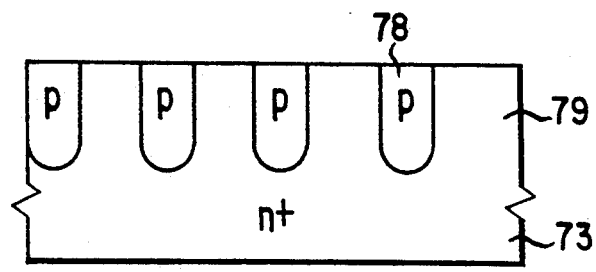
FIG. 17 is a cross sectional view showing another step of manufacturing a semiconductor device according to the fourth embodiment of the present invention.

In the next step, a p−-type layer 55 having a low impurity concentration is formed to have a thickness of about 20 μm by epitaxial growth on the surface of the substrate 73 as shown in FIG. 16, followed by selectively forming p-type regions 56 having a high impurity concentration and n-type regions 57 having a high impurity concentration by diffusing a p-type impurity and an n-type impurity into a surface region of the epitaxial layer 55. It should be noted that these p-type regions 56 formed in the epitaxial layer 55 are positioned to be aligned in the vertical direction in the drawing with the p-type regions 74 formed in said one main surface (or front surface) region of the semiconductor substrate 73. The impurity diffusion is continued until the p-type regions 56 having a high impurity concentration, which are formed in the surface region of the epitaxial layer 55, are joined to the p-type regions 74 formed in the substrate 73 to form p-type regions 78 having a larger area, as shown in FIG. 17. Likewise, the n-type regions 57 formed in a surface region of the epitaxial layer 55 are joined to the n-type semiconductor substrate 73 having a high impurity concentration so as to form n-type regions 79 having a large area. Alternatively, it is possible to form these p-type regions 78 and the n-type regions 79 by a heat treatment for the impurity diffusion after formation of the p-type regions 56 and the n-type regions 57 in the surface region of the epitaxial layer 55.

Then, an n+-type buffer layer 60 having a thickness of 15 μm and an n−-type layer 61 having a thickness of 105 μm are successively formed in this order on the p-type regions 78 having a high impurity concentration and the n-type regions 79 having a high impurity concentration, as shown in FIG. 18. In the next step, element regions including p-type base regions 62, 63, n+-type emitter regions 64, 65, a gate oxide film 66, emitter electrodes 67, 68 and a gate electrode 69 are successively formed in the surface region of the n⁻-type layer 61. In this step, the thickness of the entire system is about 520 μm.

Then, the back surface of the n-type semiconductor substrate 73 having a high impurity concentration is polished to diminish its thickness by about 390 μm so as to expose the n-type regions 79 having a high impurity concentration and the p-type regions 78 having a high impurity concentration. After the polishing treatment, a metal thin film 70 acting as a collector electrode is deposited on the polished surface to cover the p-type regions 78 having a high impurity concentration and the n-type regions 79 having a high impurity concentration so as to manufacture an anode short-circuit type IGBT which permits dissipating heat efficiently. In this embodiment, each of the p-type regions 78 and the n-type regions 79 has a high impurity concentration, with the result that a satisfactory ohmic contact can be achieved between these diffusion regions and the metal thin film (collector electrode) 70.

Fifth Embodiment

This embodiment corresponds to claim 5 and comprises the manufacturing steps shown in FIGS. 20 to 22. In the first step, n-type regions 23 having a high impurity concentration are selectively formed to have a depth of about 50 μm by diffusing an n-type impurity into a p-type semiconductor substrate 21, as shown in FIG. 20. The p-type semiconductor substrate 21 has a thickness of 400 μm. In the next step, an n⁺-type buffer layer 24 having a thickness of 15 μm and an n⁻-type layer 25 having a thickness of 105 μm are successively formed in this order on the surface of the semiconductor substrate including the n-type diffusion layers 23, as shown in FIG. 21. In this step, the thickness of the entire system is about 520 μm. Then, element regions including p-type base regions 26, 27, n⁺-type emitter regions 28, 29, a gate oxide film 30, emitter electrodes 31, 32 and a gate electrode 33 are successively formed in the surface region of the n⁻-type layer 25.

Further, the back surface of the semiconductor substrate 21 is polished to diminish its thickness by about 370 μm so as to expose the n-type regions 23 having a high impurity concentration. After the polishing treatment, a metal thin film 34 acting as a collector electrode is deposited on the polished surface so as to manufacture an anode short-circuit type IGBT.

Sixth Embodiment

Figure 24:
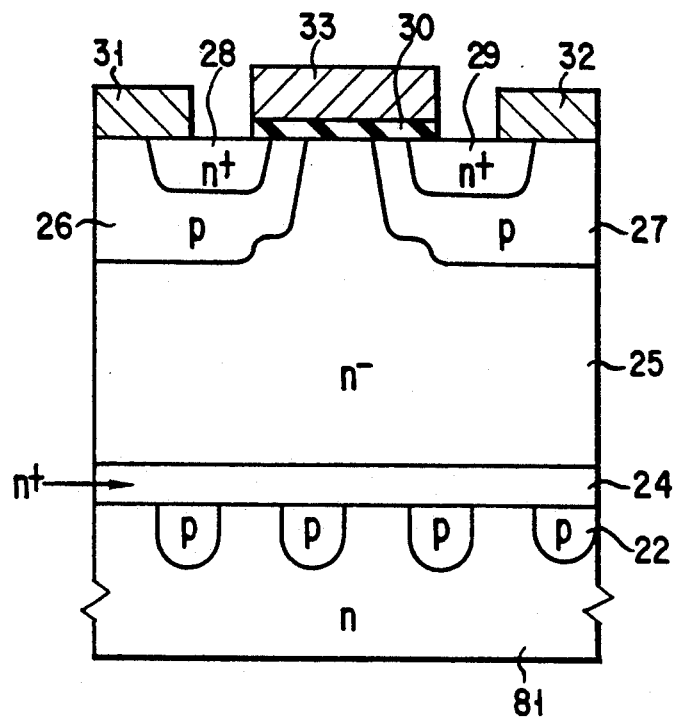
FIG. 24 is a cross sectional view showing other steps of manufacturing a semiconductor device according to the sixth embodiment of the present invention.
Figure 25:
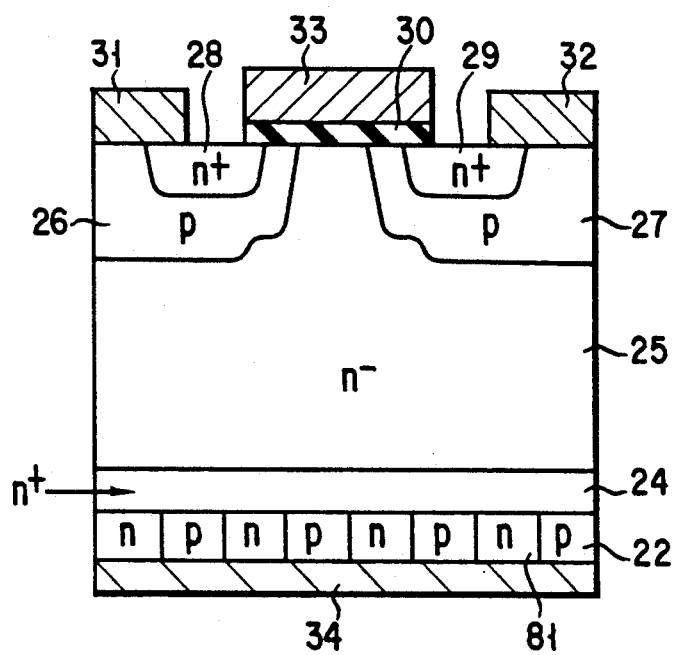
FIG. 25 is a cross sectional view showing further steps of manufacturing a semiconductor device according to the sixth embodiment of the present invention.

This embodiment corresponds to claim 6 and comprises the manufacturing steps shown in FIGS. 23 to 25. In the first step, p-type regions 22 having a high impurity concentration are selectively formed by diffusing a p-type impurity into a main surface region of an n-type semiconductor substrate 81 having a thickness of 400 μm, as shown in FIG. 23. These p-type regions 22 are formed in a depth of about 50 μm. Then, an n⁺-type buffer layer 24 having a thickness of 15 μm and an n⁻-type layer 25 having a thickness of 105 μm are successively formed in this order on the surface of the substrate 81 including the p-type regions 22, as shown in FIG. 24. In this step, the thickness of the entire system is about 520 μm. Then, element regions including p-type base regions 26, 27, n⁺-type emitter regions 28, 29, a gate oxide film 30, emitter electrodes 31, 32 and a gate electrode 33 are successively formed in the surface region of the n⁻-type layer 25.

Then, the back surface region of the n-type semiconductor substrate 81 is polished to diminish its thickness by about 370 μm to expose the p-type regions 22 of a high impurity concentration. After the polishing treatment, a metal thin film 34 acting as a collector electrode is deposited on the polished surface so as to manufacture an anode short-circuit type IGBT.

As described above in detail, the present invention provides a method of manufacturing a semiconductor device of an anode short-circuit structure, which comprises a thin n⁻-type layer having a withstand voltage of about 2000 V or less and an n⁺-type buffer layer having an ideal impurity concentration profile. The semiconductor device manufactured by the method of the present invention exhibits a satisfactory relationship between the switching characteristics and the on-voltage. Particularly, the relationship in the low current region can be markedly improved in the present invention, compared with the conventional IGBT.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
   selectively diffusing an impurity of a first conductivity type and another impurity of a second conductivity type into a main surface region of a semiconductor substrate so as to form first semiconductor regions of the first conductivity type and second semiconductor regions of the second conductivity type;
   forming a first semiconductor layer of the second conductivity type on the semiconductor substrate, said first semiconductor layer being of at least a single layer structure;
   forming element regions of the first and second conductivity types by thermal diffusion of impurities into the first semiconductor layer; and
   polishing the opposite main surface of the semiconductor substrate to expose the first semiconductor regions of the first conductivity type and the second semiconductor regions of the second conductivity type.

2. A method of manufacturing a semiconductor device, comprising the steps of:
   selectively diffusing an impurity of a first conductivity type and another impurity of a second conductivity type into a main surface region of a semiconductor substrate so as to form first semiconductor regions of the first conductivity type and second semiconductor regions of the second conductivity type;
   selectively forming third semiconductor regions of the first conductivity type and fourth semiconductor regions of the second conductivity type in the opposite main surface region of the semiconductor substrate by selectively diffusing impurities of the first and second conductivity types into the substrate through the opposite main surface;
   forming a first semiconductor layer of the second conductivity type on the semiconductor substrate, said first semiconductor layer being of at least a single layer structure;

forming element regions of the first and second conductivity types by thermal diffusion of impurities into the first semiconductor layer; and combining the first and third semiconductor regions by thermal diffusion of an impurity and combining the second and fourth semiconductor regions by thermal diffusion of another impurity.

3. A method of manufacturing a semiconductor device, comprising the steps of:

selectively forming by thermal diffusion of an impurity fifth semiconductor regions of a second conductivity type in a main surface region of a semiconductor substrate of a first conductivity type having a high impurity concentration;

forming a second semiconductor layer of the first conductivity type or a second conductivity type on the semiconductor substrate, said second semiconductor layer having a low impurity concentration;

selectively forming first semiconductor regions of the first conductivity type and second semiconductor regions of the second conductivity type in the second semiconductor layer by selective diffusion of impurities;

forming a first semiconductor layer of the second conductivity type on the second semiconductor layer, said first semiconductor layer being of at least a single layer structure;

forming element regions of the first and second conductivity types on the first semiconductor layer by thermal diffusion of impurities;

applying a heat treatment to combine the first semiconductor regions and the main surface region of a semiconductor substrate, and the second and fifth semiconductor regions by thermal diffusion of an impurity; and polishing the opposite main surface of the semiconductor substrate to expose the semiconductor regions of the first and second conductivity types.

4. A method of manufacturing a semiconductor device, comprising the steps of:

selectively forming sixth semiconductor regions of a first conductivity type in a main surface region of a semiconductor substrate of a second conductivity type having a high impurity concentration;

forming a second semiconductor layer of the first or second conductivity type having a low impurity concentration on the semiconductor substrate;

selectively forming first semiconductor regions of the first conductivity type and second semiconductor regions of the second conductivity type in the second semiconductor layer by means of a selective impurity diffusion;

forming a first semiconductor layer of the second conductivity type on the second semiconductor layer, said first semiconductor layer being of at least a single layer structure;

forming element regions of the first and second conductivity types on the first semiconductor layer by means of thermal diffusion of impurities;

applying a heat treatment to combine the second semiconductor regions and the main surface of a semiconductor substrate, and the first and sixth semiconductor regions by thermal diffusion of an impurity; and polishing the opposite main surface of the semiconductor substrate to expose the semiconductor regions of the first and second conductivity types.

5. A method of manufacturing a semiconductor device, comprising the steps of:

selectively forming second semiconductor regions of a second conductivity type in a main surface region of a semiconductor substrate of a first conductivity type by impurity diffusion;

forming a first semiconductor layer of the second conductivity type on the semiconductor substrate, said first semiconductor layer being of at least a single layer structure;

forming element regions of the first and second conductivity types on the first semiconductor layer by thermal diffusion of impurities; and polishing the opposite main surface of the semiconductor substrate to expose the second semiconductor region of the second conductivity type.

6. A method of manufacturing a semiconductor device, comprising the steps of:

selectively forming first semiconductor regions of a first conductivity type by impurity diffusion in a main surface region of a semiconductor substrate of a second conductivity type;

forming a first semiconductor layer of the second conductivity type on the semiconductor substrate, said first semiconductor layer being of at least a single layer structure;

forming element regions of the first and second conductivity types by thermal diffusion of impurities into the first semiconductor layer; and polishing the opposite main surface of the semiconductor substrate to expose the first semiconductor region of the first conductivity type.

7. The method of manufacturing a semiconductor device according to any one of claims 1 to 6, wherein said first semiconductor layer is of a laminate structure consisting of a plurality of semiconductor layers differing from each other in the impurity concentration.

* * * * *